(12) United States Patent
Coenen (10) Patent No.: US 11,936,385 B2
(45) Date of Patent: Mar. 19, 2024

(54) APPARATUS AND METHODS FOR PRODUCING STABLE CLOCK SIGNALS BASED ON A VARYING FREQUENCY SOURCE CLOCK

(71) Applicant: SEMICONDUCTOR COMPONENTS INDUSTRIES, LLC, Phoenix, AZ (US)

(72) Inventor: Ivo Leonardus Coenen, Coffrane (CH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/820,007

(22) Filed: Aug. 16, 2022

(65) Prior Publication Data

US 2023/0053440 A1 Feb. 23, 2023

Related U.S. Application Data

(60) Provisional application No. 63/260,432, filed on Aug. 19, 2021.

(51) Int. Cl.
  *H03K 5/00* (2006.01)
  *G06F 1/10* (2006.01)

(52) U.S. Cl.
  CPC ........... *H03K 5/00006* (2013.01); *G06F 1/10* (2013.01)

(58) Field of Classification Search
  CPC ..... H03K 5/00006; H03K 2005/00286; H03K 23/68; G06F 1/10; G06F 1/06; G06F 1/08; G06F 1/3203; G06F 1/324; H03L 7/16; H03L 7/18; H03L 7/08; H03L 7/1806; H03L 7/197; H03L 7/1976
  See application file for complete search history.

(56) References Cited

U.S. PATENT DOCUMENTS

| | | | |
|---|---|---|---|
| 7,920,006 B1 * | 4/2011 | Keramat | G06F 1/06 377/47 |
| 8,928,505 B1 | 1/2015 | Coenen et al. | |
| 2007/0208964 A1 * | 9/2007 | Sandon | H03L 7/16 713/501 |
| 2008/0028249 A1 | 1/2008 | Agrawal | |
| 2008/0046773 A1 * | 2/2008 | Ham | G06F 1/324 713/500 |
| 2011/0280109 A1 * | 11/2011 | Raymond | G04G 7/005 327/160 |

* cited by examiner

*Primary Examiner* — John W Poos
(74) *Attorney, Agent, or Firm* — Brake Hughes Bellermann LLP (57) ABSTRACT

In some aspects, the techniques described herein relate to a system on a chip (SoC) including a first clock divider configured to: receive an oscillator signal at a first frequency; produce, based on the oscillator signal: a first clock signal at the first frequency; and a second clock signal at a second frequency, the second frequency being a division of the first frequency. The first clock divider can selectively provide the first clock signal or the second clock signal as a first output clock signal based on a scaling configuration signal. The first clock divider can produce a frequency indication signal indicating, in combination with the first output clock signal, a start of a new clock period of the second clock signal. The SoC can include a second clock divider configured to provide a second clock output signal based on the first output clock signal and the frequency indication signal.

24 Claims, 6 Drawing Sheets

APPARATUS AND METHODS FOR PRODUCING STABLE CLOCK SIGNALS BASED ON A VARYING FREQUENCY SOURCE CLOCK

RELATED APPLICATION

This application claims the benefit of and priority to U.S. Provisional Application No. 63/260,432, filed Aug. 19, 2021, which is incorporated by reference herein in its entirety.

TECHNICAL FIELD

This description relates to generation and throttling of clock signals. More specifically, this disclosure relates apparatus and method for producing one or more stable clock signals, e.g., at constant respective frequencies, in a glitch free manner based on a source clock with two more selectable frequencies.

BACKGROUND

In design and development of electronic devices and systems, such as System on a Chip (SoC) device implementation, a tradeoff between performance and power consumption can be a principal consideration. For instance, in devices and systems that operate on battery power, this consideration may become even more important. Further, in devices and systems with small form factors, such as, for example, hearing aids, medical implants, wearable devices, etc., an amount of available battery storage can be limited by the corresponding form factor, which can further increase the importance of power consumption management.

Taking measures to reduce overall power consumption, such as by reducing operating voltages, reducing clock signal frequencies, etc., can be difficult to achieve. For instance, in some devices and systems, selecting a clock signal operation frequency and associated operating voltage can be dependent on an expected peak processing bandwidth demand for the device, which can preclude achieving such power savings. Managing the tradeoff between performance and power consumption can be further complicated in devices and systems that include different portions of circuitry (e.g., operational blocks) that operate using clock signals with different respective frequencies. That is, in such devices and systems, taking measures to reduce power consumption can adversely affect the generation these different frequency clock signals, such as by causing clock signal jitter, changing signal timing (e.g., adversely affecting setup and hold timing), etc.

As an example, Bluetooth Low-Energy (BLE) products (SoCs) can operate using a system clock that is used to operate (clock) at least some portions of circuitry included in the corresponding SoC, such as a baseband clock. Additionally, the system clock can be provided to one or more clock dividers that provide clock signals for other portions of circuitry included in the SoC, such as for near-field magnetic induction circuitry, or other types of circuitry, such as for operating an audio output driver. While, in such SoCs, it may be possible to change the system clock frequency, e.g., using software approaches, while a corresponding application is running in the SoC, doing so, while maintaining stability of the various clock signals, would be very complex, e.g. due to the baseband controller having to be switched off temporarily while a corresponding Bluetooth stack is operating, which can disrupt operation of portions of the circuitry.

SUMMARY

In some aspects, the techniques described herein relate to a system on a chip (SoC) including: a first clock divider configured to: produce, based on an oscillator signal at a first frequency: a first clock signal at the first frequency; and a second clock signal at a second frequency being a division of the first frequency by an integer greater than 1; selectively provide the first clock signal as a first output clock signal when a scaling configuration signal has a first value; selectively provide the second clock signal as the first output clock signal when the scaling configuration signal has a second value; and produce a frequency indication signal indicating, in combination with the first output clock signal, a start of a new clock period of the second clock signal; and a second clock divider configured to: produce a second output clock signal at a third frequency, the second output clock signal being based on the first output clock signal and the frequency indication signal, the third frequency being a division of the second frequency by an integer greater than or equal to 1.

In some aspects, the techniques described herein relate to a SoC, where the frequency indication signal is a captured frequency indication signal, the SoC further including a capture circuit configured to: capture the frequency indication signal based on the first output clock signal; and provide the captured frequency indication signal to the second clock divider.

In some aspects, the techniques described herein relate to a SoC, wherein the capture circuit includes a flip-flop that is clocked on rising edges of the first output clock signal.

In some aspects, the techniques described herein relate to a SoC, further including a third clock divider configured to: receive the second output clock signal; and produce, based on the second output clock signal, a third output clock signal at a fourth frequency, the fourth frequency being a division of the third frequency by an integer greater than or equal to 1.

In some aspects, the techniques described herein relate to a SoC, further including a fourth clock divider configured to: receive the third output clock signal; and produce, based on the third output clock signal, a fourth output clock signal at a fifth frequency, the fifth frequency being a division of the fourth frequency by an integer greater than or equal to 1.

In some aspects, the techniques described herein relate to a SoC, further including a third clock divider configured to: receive the first output clock signal; receive the frequency indication signal; and produce a third output clock signal at a third frequency, the third output clock signal being based on the first output clock signal and the frequency indication signal, the third frequency being a division of the second frequency by an integer greater than or equal to 1.

In some aspects, the techniques described herein relate to a SoC, wherein the scaling configuration signal is captured by the first clock divider on a rising edge of the first clock signal at a start of a new clock period of the second clock signal, the captured scaling configuration signal controlling multiplexing between the first clock signal and the second clock signal for the first output clock signal.

In some aspects, the techniques described herein relate to a SoC, further including digital circuitry operating based on a least one of the first output clock signal or the second output clock signal, wherein: the digital circuitry operates at a first voltage when the first clock signal is selected as the first output clock signal; and the digital circuitry operates a second voltage when the second clock signal is selected as the first output clock signal.

In some aspects, the techniques described herein relate to a SoC, wherein the scaling configuration signal is provided by the digital circuitry.

In some aspects, the techniques described herein relate to a SoC, wherein the first clock divider is further configured to: produce, based on the oscillator signal a third output clock signal at a third frequency, the third frequency being a division of the first frequency by an integer greater than or equal to 1.

In some aspects, the techniques described herein relate to a SoC, further including: a clock gate configured to: receive the third output clock signal; receive a first clock gate enable signal provided by the digital circuitry; and provide, based on the third output clock signal and the clock gate enable signal, a first gated clock signal.

In some aspects, the techniques described herein relate to a SoC, wherein the first clock divider is further configured to: produce, based on the oscillator signal a third output clock signal at a third frequency, the third frequency being a division of the first frequency by an integer greater than 1.

In some aspects, the techniques described herein relate to a SoC, further including: a clock gate configured to: receive the third output clock signal; receive a first clock gate enable signal provided by the digital circuitry; and provide, based on the third output clock signal and the clock gate enable signal, a first gated clock signal.

In some aspects, the techniques described herein relate to a system on a chip (SoC) including: an oscillator configured to produce an oscillator signal at a first frequency; a first clock divider configured to: produce, based on the oscillator signal: a first clock signal at the first frequency; and a second clock signal at a second frequency being a division of the first frequency by an integer greater than 1; selectively provide the first clock signal as a first output clock signal when a scaling configuration signal has a first value; selectively provide the second clock signal as the first output clock signal when the scaling configuration signal has a second value; and produce a frequency indication signal indicating, in combination with the first output clock signal, a start of a new clock period of the second clock signal; a second clock divider configured to: produce a second output clock signal at a third frequency, the second output clock signal being based on the first output clock signal and the frequency indication signal, the third frequency being a division of the second frequency by an integer greater than or equal to 1; and a third clock divider configured to: produce, based on the second output clock signal, a third output clock signal at a fourth frequency being a division of the third frequency by an integer greater than 1.

In some aspects, the techniques described herein relate to a SoC, further including a fourth clock divider configured to: receive the first output clock signal; receive the frequency indication signal; and produce a fourth output clock signal at a fifth frequency, the fourth output clock signal being based on the first output clock signal and the frequency indication signal, the fifth frequency being a division of the second frequency by an integer greater than or equal to 1.

In some aspects, the techniques described herein relate to a SoC, where the frequency indication signal is a captured frequency indication signal, the SoC further including a capture circuit configured to: capture the frequency indication signal based on the first output clock signal; and provide the captured frequency indication signal to the fourth clock divider.

In some aspects, the techniques described herein relate to a SoC, where the frequency indication signal is a captured frequency indication signal, the SoC further including a capture circuit configured to: capture the frequency indication signal based on the first output clock signal; and provide the captured frequency indication signal to the second clock divider.

In some aspects, the techniques described herein relate to a method for operation a system on a chip (SoC), the method including: producing, based on an oscillator signal at a first frequency, a first clock signal at the first frequency; producing, based on the oscillator signal, a second clock signal at a second frequency being a division of the first frequency by an integer greater than 1; selectively, based on a scaling configuration signal: providing the first clock signal as a first output clock signal when the scaling configuration signal has a first value; or providing the second clock signal as the first output clock signal when the scaling configuration signal has a second value; producing a frequency indication signal indicating, in combination with the first output clock signal, a start of a new clock period of the second clock signal; and producing, by a second clock divider, a second output clock signal at a third frequency, the second output clock signal being based on the first output clock signal and the frequency indication signal, the third frequency being a division of the second frequency by an integer greater than or equal to 1.

In some aspects, the techniques described herein relate to a method, further including: receiving the second output clock signal at a third clock divider; and producing, by the third clock divider based on the second output clock signal, a third output clock signal at a fourth frequency, the fourth frequency being a division of the third frequency by an integer greater than or equal to 1.

In some aspects, the techniques described herein relate to a method, further including a third clock divider configured to: receiving the first output clock signal at a third clock divider; receiving the frequency indication signal at the third clock divider; and producing, by the third clock divider based on the first output clock signal and the frequency indication signal, a third output clock signal at a fourth frequency, the fourth frequency being a division of the second frequency by an integer greater than or equal to 1.

BRIEF DESCRIPTION OF THE DRAWINGS

Like reference symbols in the various drawings indicate like and/or similar elements.

DETAILED DESCRIPTION

This disclosure relates to circuits and/or systems, such as systems on a chip (SoCs), and associated methods, for clock throttling that can overcome at least some of the drawbacks of current approaches. In the described implementations, digital circuitry is used for dynamically switching a frequency of a supplied system clock between two more frequencies, while keeping all clocks signals that are derived from, or based on that system clock, stable. For instance, in an example implementation, e.g., for a SoC used in a hearing aid application, the approaches described herein can allow for providing stable, respective clock signals for operation of a baseband controller, near-field magnetic induction circuitry, a digital microphone, an audio output driver, timers, etc.

For instance, the described approaches allow for selectively lowering a frequency of a provided system clock and an associated operating voltage for corresponding circuitry, such as digital logic. That is, the described approaches allow for reducing system clock frequency and operating voltage when an amount of processing bandwidth being used decreases, and increasing the system clock frequency when an amount of processing bandwidth increases. Using the approaches described herein, switching between system clock frequencies is accomplished in a glitch-free manner, while keeping frequency and timing stable for clock signals that are based on (derived from) the system clock signal without requiring synchronous operation between the system clock and other clock trees (e.g., clock dividers).

Figure 1:
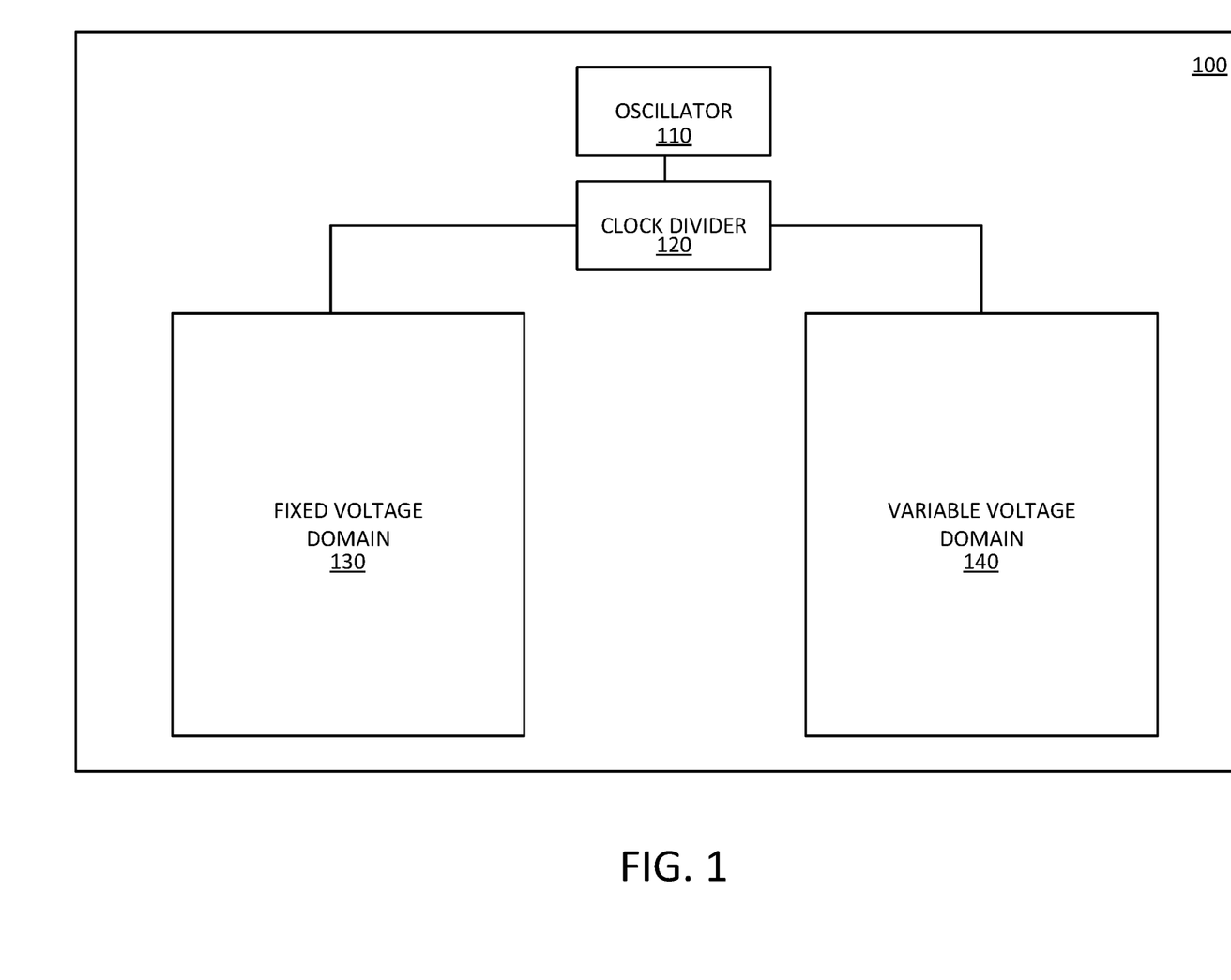
FIG. 1 is a high-level block diagram schematically illustrating an example device, e.g., system on a chip (SoC) in which clock throttling using the approaches described herein can be implemented.

FIG. 1 is a high-level block diagram schematically illustrating an example device, e.g., system on a chip (SoC 100), in which clock throttling using the approaches described herein can be implemented. As shown in FIG. 1, the SoC 100 can include an oscillator 110, a clock divider 120, fixed voltage domain circuitry 130 and variable voltage domain circuitry 140. In some implementations, the oscillator 110 and the clock divider 120 can also operate in the fixed voltage domain of the fixed voltage domain circuitry 130. In the example implementations described herein, a fixed voltage domain can also be referred to as a high voltage domain, and a variable voltage domain can also be referred to as an adjustable voltage domain.

In the SoC, the variable voltage domain circuitry 140 can include digital circuitry implementing one or more processors, one or more memories, one or more peripherals, etc., that can have a variable processing load. Accordingly, using the clock throttling techniques described herein to provide a varying a clock signal with a varying frequency (and varying an associated operating voltage) to the variable voltage domain circuitry 140 can achieve power savings when operating the SoC 100. Such power savings can be realized due to reductions in both switching current (at lower frequency) and leakage current (at lower operating voltage). For instance, the clock divider 120 can be configured to provide a clock signal to the variable voltage domain circuitry 140, where a frequency of that clock signal is varied (changed) based on a configuration signal received from the variable voltage domain circuitry 140 (e.g., from an application running in the variable voltage domain circuitry 140) indicating a desired processing bandwidth.

For instance, if lower processing bandwidth is indicated, a lower frequency (divided) clock signal can be provided by the clock divider 120, while if higher processing bandwidth is indicated, a higher frequency (undivided) clock signal can be provided by the clock divider 120. An operating voltage of the variable voltage domain circuitry 140 can be adjusted in correspondence with the provided clock signal. For instance, the operating voltage can be reduced for lower processing bandwidth and an associated lower frequency provided system clock signal. Further, the operating voltage for the variable voltage domain circuitry 140 can be increased, e.g., to be consistent with an operating voltage of the fixed voltage domain circuitry 130, for higher processing bandwidth and an associated higher frequency provided system clock signal.

Figure 2:
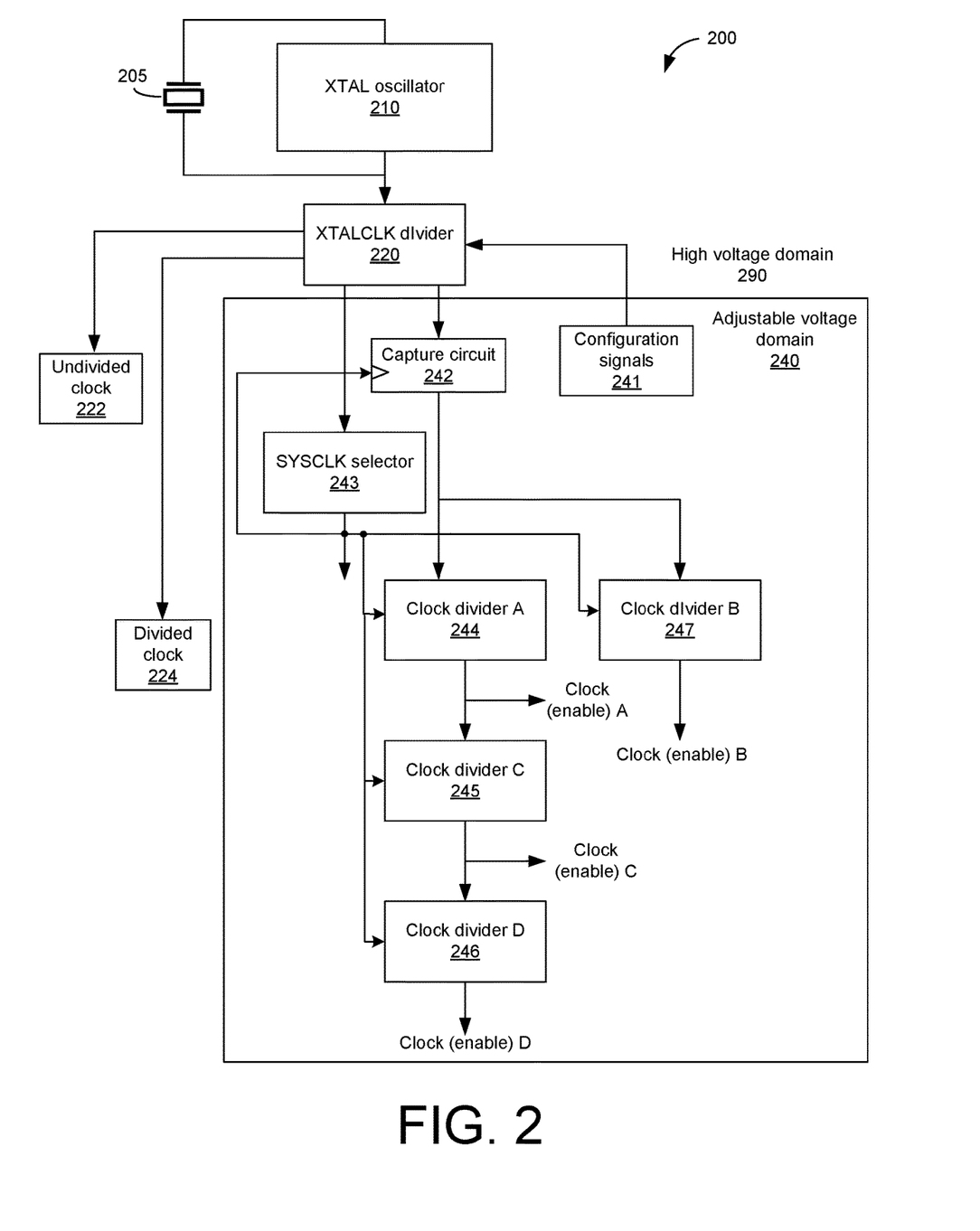
FIG. 2 is a block diagram illustrating an example SoC implementing clock throttling.
Figure 3:
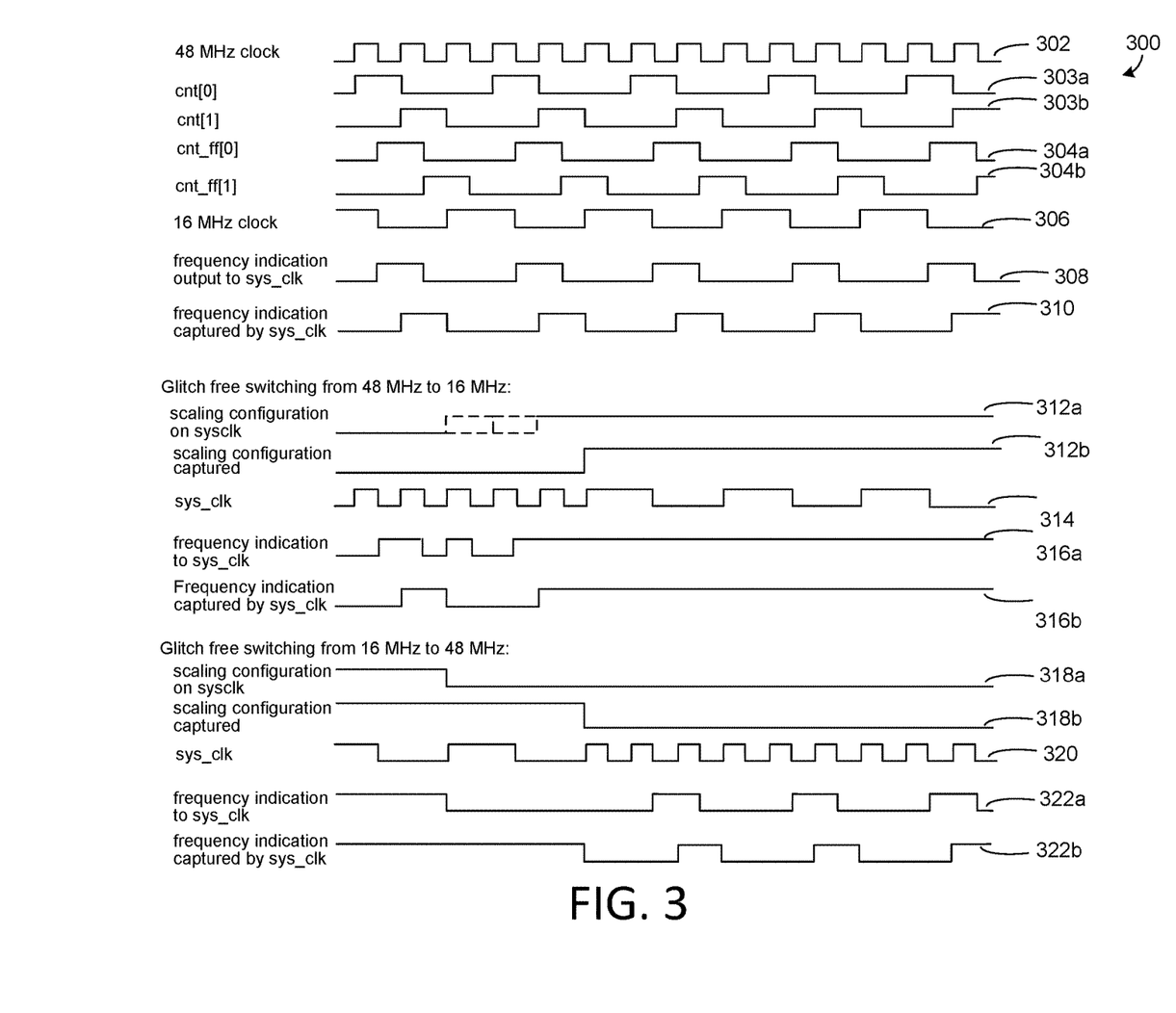
FIG. 3 is a timing diagram illustrating example signal timing corresponding with the example SoC of FIG. 2.

Using the approaches described herein, such as those described with respect to, at least, FIGS. 2 and 3, changing between provided clock frequencies can be done in a glitch-free manner, e.g., such that signals within the variable voltage domain circuitry 140 have suitable timing (e.g., setup and hold timing), and clock signals generated by various clock trees (clock dividers) within the variable voltage domain circuitry 140, such as clock signals for operating various functional blocks in the variable voltage domain circuitry 140, remain stable.

In the example implementations described herein, the clock divider 120 can be configured to a generate a signal that indicates when clock dividers in the variable voltage domain circuitry 140 should be counting for purposes of providing respective, stable output clock signals. This signal, in the described implementations, is generated such that it can be captured by logic in the variable voltage domain circuitry 140 with correct setup and hold time without having to synchronize the clock trees associated with those dividers to the variable frequency clock signal provided to the variable voltage domain circuitry 140 as a system clock signal.

In some implementations, the clock divider 120 can also generate clock signals for other circuitry (circuit blocks) that operate based on a fixed and precise clock signal (e.g., a low jitter clock signal for operating a digital output driver). These can clock signals can operate (be provided) in a voltage domain of the fixed voltage domain circuitry 130, e.g., to prevent jitter degradation that can occur when as a result of passing those clock signals through digital circuitry operating at a lower supply voltage. The clock divider 120 can also be configured to provide clock signal output signals (e.g., undivided clock output signals) to logic circuitry running at high frequency, and thus operating on a higher supply voltage than the reduced voltage of the fixed voltage domain circuitry 130 during periods of low processing bandwidth (e.g., a clock signal for sampling of a bitstream output of an analog receiver radio frontend that needs to parallelized).

FIG. 2 is a block diagram illustrating an example SoC (SoC 200) in which clock throttling using the approaches described herein is utilized. In implementations, the SoC 200 can be an implementation of the SoC 100 of FIG. 1. As shown in FIG. 1, the SoC 200 can include a high voltage domain 290 (fixed voltage domain) and an adjustable voltage domain 240 (variable voltage domain). As shown in FIG. 2, for this example, the SoC 200 can include a XTAL oscillator 210, a XTALCLK divider 220, an undivided clock 222 and a divided clock 224 that operate in the high voltage domain 290. A crystal 205 can be coupled with the XTAL oscillator 210, where crystal 205 is external to a semiconductor device used to circuitry of the high voltage domain 290 and the adjustable voltage domain 240.

In this example, digital circuitry in the adjustable voltage domain 240 can provide configuration signals 241 to the XTAL clock divider 220. In some implementations, these configuration signals can include a scaling configuration signal and one or more gated clock enable signals.

The scaling configuration signal can be a signal that is provided from the adjustable voltage domain 240 to the XTAL clock divider 220, e.g., by application running on a processor in the adjustable voltage domain 240, to indicate a desired processing bandwidth, e.g., such as whether high-frequency operation or low-frequency operation of circuitry in the adjustable voltage domain 240 is desired. In some implementations, the scaling configuration signal can captured by the XTAL clock divider 220 (e.g., using a flip-flop) on a rising edge of the first clock signal at a start of a new clock period of the second clock signal, and the captured scaling configuration signal can be used to control a multiplexer for selecting between the first clock signal and the second clock signal for providing the first output clock signal.

The gated clock enable signals can be used by the XTAL clock divider 220, the undivided clock 222 and/or the divided clock 224 to respectively control, or gate the undivided clock 222 and/or the divided clock 224, which can reduce power consumption by reducing switching current of associated circuitry. That is, the undivided clock 222 and/or the divided clock 224 can be enabled or disabled by a respective gated clock enable signal, as appropriate for a particular implementation. That is, when enabled by a corresponding gated clock enable signal, the undivided clock 222 and the divided clock 224 will provide a respective clock signal to associated circuitry. When disabled by a corresponding gated clock enable signal, the undivided clock 222 and the divided clock 224 will not provide their respective clock signals to associated circuitry. In some implementations, though not specifically described herein, clock signals within the adjustable voltage domain 240 can also operated as gated clock signals, which are enable and disabled based on respective gated clock enable signals included, e.g., in the configuration signals 241.

In this example, the XTAL clock divider 220 can be configured to receive an oscillator signal at a first frequency from the XTAL oscillator 210, where the first frequency corresponds with an oscillation frequency of the crystal 205. The XTAL clock divider 220 can be further configured to produce, based on the oscillator signal, a first clock signal at the first frequency, and a second clock signal at a second frequency. The first clock signal can, in some implementations, be a buffered version of the oscillator signal, while the while the second clock signal can be a divided version of the first clock signal or the oscillator signal. In this example, the second frequency can be a division of the first frequency by an integer greater than 1. This division can be accomplished using one or more counters to which the first clock signal (or the oscillator signal) is applied. The number of counters used will depend on the division factor. For example, for even division factors, a single counter can be used, while for odd division factors, two counters can be used. Such counters can be configurable to achieve different division factors.

The XTAL clock divider 220, as noted above, can receive the scaling configuration signal from the adjustable voltage domain 240 and the capture the scaling configuration. Based on the captured scaling configuration signal, the XTAL clock divider 220 can selectively provide the first clock signal as a first output clock signal when the captured scaling configuration signal has a first value (indicating high processing bandwidth is desired), or selectively provide the second clock signal as the first output clock signal when the captured scaling configuration signal has a second value (indicating low processing bandwidth is desired).

In this example, the XTAL clock divider 220 can be further configured to produce a frequency indication signal that indicates, in combination with the first output clock signal, a start of a new clock period of the second clock signal. For instance, the frequency indication signal can be captured by a capture circuit 242 in the adjustable voltage domain 240. In some implementations, the capture circuit 242 can include a flip-flop that is clocked on a rising edge of the provided output signal (e.g., the system clock signal). The captured frequency indication signal can indicate to a clock divider implemented in the adjustable voltage domain 240 (e.g., a clock divider A 244 and/or a clock divider B 247) whether it should (using an included counter) be counting rising edges of the provided first output clock signal for producing a respective output clock signal.

For instance, in the example of FIG. 2, the clock divider A 244 can be configured to receive the first output clock signal and receive the frequency indication signal. The clock divider A 244 can then, based on the first output clock signal and the frequency indication signal, produce a second output clock signal at a third frequency, where the third frequency is a division of the second frequency. Depending on a configuration of a counter (or counters) used to implement the clock divider A 244, the division factor for determining the third frequency from the second frequency can be an integer value greater than or equal to 1 (odd or even division). In this example, a clock divider B 247 can operate similarly to the clock divider A 244, e.g., using a same or a different division factor.

In FIG. 2, a SYSCLK selector 243 is illustrated. The SYSCLK selector 243 can be implemented using a multiplexer to select between the output clock signal from the XTAL clock divider 220 and other clock sources, such as externally generated clock signals. In the discussion herein, the SYSCLK selector 243 is presumed to be selecting the first output clock signal (divided or undivided) from the XTAL clock divider 220.

As shown in FIG. 2, the SoC 200 further includes, in the adjustable voltage domain 240, a clock divider C 245 that is configured to receive the second output clock signal from the clock divider A 244, and produce, based on the second output clock signal, a third output clock signal at a fourth frequency. The fourth frequency can be a division of the third frequency by an integer greater than or equal to 1. In this example, the second output clock signal from the clock divider A 244 can be used as an enable signal by the clock divider C 245, indicating when the clock divider C 245 should count rising edges of the first output clock signal (e.g., the system clock). In other implementations, the clock divider C could be configured to divide the second output clock signal without counting rising edges of the system clock, but by counting rising edges of the second output clock signal received from the clock divider A 244. The configuration of a counter used to implement the clock divider C 245 (and its associated count value) will depend on the particular configuration.

In the example of FIG. 2, the SoC 200 further includes, in the adjustable voltage domain 240, a clock divider D 246 that is configured to receive the third output clock signal from the clock divider C 245, and produce, based on the third output clock signal, a fourth output clock signal at a fifth frequency. The fifth frequency can be a division of the fourth frequency by an integer greater than or equal to 1. In this example, the third output clock signal from the clock divider C 245 can be used as an enable signal by the clock divider D 246, indicating when the clock divider D 246 should count rising edges of the first output clock signal (e.g., the system clock). In other implementations, the clock divider D 246 could be configured to divide the third output clock signal without counting rising edges of the system clock, but by counting rising edges of the third output clock signal received from the clock divider C 245. The configuration of a counter used to implement the clock divider D 246 (and its associated count value) will depend on the particular configuration.

FIG. 3 is a timing diagram 300 illustrating example signal timing corresponding with an implementation of the SoC of FIG. 2. Accordingly, for purposes of illustration, the timing diagram 300 will be described with further reference to FIG. 2. Specifically, the timing diagram 300 illustrates timing for signals associated with glitch-free switching of a system clock for the adjustable voltage domain 240 between an undivided clock signal (the first clock signal of the XTAL clock divider 220) and a divided clock signal (the second clock signal of the XTAL clock divider 220). In this example, the timing diagram 300 illustrates timing of signals produced and used by the XTAL clock divider 220 and timing of signals produced and used in the adjustable voltage domain 240, including timing of the frequency scaling signal of the configuration signals 241 (scaling configuration in FIG. 3, e.g., signal 312*a* and 318*a*), timing of capture of the scaling configuration signal by the XTAL clock divider 220 (e.g., signal 312*b* and signal 318*b*), timing of the frequency indication signal from the XTAL clock divider 220 (e.g., signal 316*a* and signal 322*a*), timing of capture of the frequency indication signal by the capture circuit 242 in the adjustable voltage domain 240 (e.g., signal 316*b* and signal 322*b*), and timing of the first output clock signal (system clock) provided by the XTAL clock divider 220 to circuitry of the adjustable voltage domain 240 (e.g., signal 314 and signal 320).

For instance, in the example of FIG. 3, a signal 302 represents the first clock signal (high frequency clock signal) produced by the XTAL clock divider 220. In this example, the signal 302 is a 48 MHz clock signal that is produced from a 48 MHz oscillator signal provided to the XTAL clock divider 220 from the XTAL oscillator 210. A signal 306 in FIG. 3 represents the second clock signal (low frequency clock signal) produced by the XTAL clock divider 220. In this example, the signal 306 is a 16 MHz clock signal that is produced from the signal 302. In some implementations, the signal 306 can be produced from the 48 MHz oscillator signal.

As shown in FIG. 3, a rising edge 2-bit counter and a falling edge 2-bit counter (e.g., both with count values of three), are used to count, respectively rising and falling edges of the signal 302. A signal 303*a* corresponds with bit 0 of the rising edge counter (e.g., cnt[0]), a signal 303*b* corresponds with bit 1 of the rising edge counter (e.g., cnt[1]), a signal 304*a* corresponds with bit 0 of the falling edge counter (e.g., cnt MOD, and a signal 304*b* corresponds with bit 1 of the falling edge counter (e.g., cnt ff[1]). A count of three is used, as that corresponds with the division factor between the first clock signal and the second clock signal of the XTAL clock divider 220 (i.e., 48 divided by 3 is 16). In this example, the signal 306 (16 MHz clock signal) is produced by combining the signal 303*b* and the signal 304*a* using a NOR operation.

A signal 308 (e.g., frequency indication) illustrates a one-third duty cycle signal at a frequency of the signal 306, where the signal 308 is the same as, or equivalent to the signal 304*a*, and the signal 310 represents the signal 308 when captured by the capture circuit 242 in the adjustable voltage domain 240 The signal 308, in this example, is used for generation of the frequency indication signal. In this example, when the signal 306 is provided as the system clock signal in the adjustable voltage domain 240 (e.g., 16 MHz signal as the first output clock signal of the XTAL clock divider 220), the frequency indication signal provided by the XTAL clock divider 220 and captured by the capture circuit 242 is always active (logic 1), such as is shown in FIG. 3, e.g., by relating the signal 314 with the signal 316*b*, or relating the signal 320 with the signal 322*b*.

Further in this example, when the signal 302 is provided as the system clock signal in the adjustable voltage domain 240 (e.g., 48 MHz signal as the first output clock signal of the XTAL clock divider 220), the frequency indication signal provided by the XTAL clock divider 220 corresponds with the signal 304*a* (the one-third duty cycle, 16 MHz signal). In FIG. 3, a signal 316*b* and a signal 322*b* represent examples of the frequency indication signal after it is captured by the capture circuit 242. The signal 316*b* is an example of the captured frequency indication signal when switching from an undivided system clock (e.g., the to a divided system clock occurs, as shown by a sys_clk signal 314 (which corresponds with a system clock for adjustable voltage domain 240). The signal 323*b* is an example of the captured frequency indication signal when switching from a divided system clock to a undivided system clock occurs, as shown by a sys_clk signal 320 (which corresponds with a system clock for adjustable voltage domain 240).

As shown in FIG. 3, in this example, switching from providing the first clock signal 302 (48 MHz clock signal) to providing the second clock signal 306 (16 MHz clock signal) as a system clock signal (signal 314) to the adjustable voltage domain 240 can be done in a glitch-free manner. For instance, to provide glitch-free switching between frequency domains (48 MHz to 16 MHz) a version of the signal 303*b* (or the signal 303*b* itself) can be used to ensure that the signal 312*a* (the frequency scaling indication signal) is captured by the XTAL clock divider 220, as signal 312*b*, on a rising edge of the second clock signal 306 (e.g., by ensuring that the version of the signal 303*b* does not transition from low to high when the captured prescale signal 312*b* is low, or before it is captured by the XTAL clock divider 220). This ensures that the frequency domain change occurs at the start of a new clock cycle of the signal 306 (the 16 MHz clock), and further ensures that clock signals generated by clock dividers in the adjustable voltage domain 240 remain stable. As shown in FIG. 3 the signal 312*b* can change at different points (e.g., 3 different points) in the timing cycle, but is not captured by the XTAL clock divider 220 until the next rising edge of the signal 306 (the 16 MHz clock signal).

Likewise, in this example, switching from providing the second clock signal 306 (16 MHz clock signal) to providing the second clock signal 302 (48 MHz clock signal) as a system clock signal (signal 330) to the adjustable voltage domain 240 can be similarly done in a glitch-free manner. For instance, to provide glitch-free switching between frequency domains (16 MHz to 48 MHz) the version of the signal 303*b* (or the signal 303*b* itself) can be used to ensure the signal 318*a* is captured by the XTAL clock divider 220 on a rising edge of the second clock signal 306 (e.g., by ensuring that the version of the signal 303*b* does not transition from high to low when the captured prescale signal 318*b* is low). This ensures that the frequency domain change occurs at the start of a new clock cycle of the signal 306 (the 16 MHz clock), and further ensures that clock signals generated by clock dividers in the adjustable voltage domain 240 remain stable.

Figure 4:
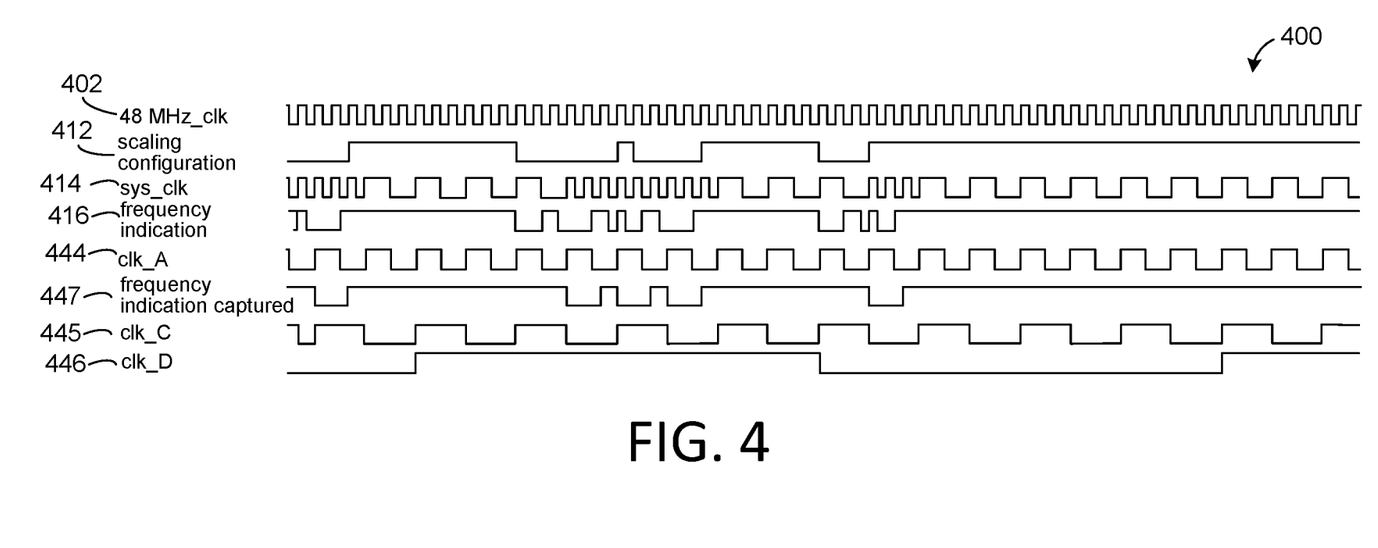
FIG. 4 is a timing diagram illustrating further example time corresponding with the example SoC of FIG. 2.

FIG. 4 is a timing diagram 400 illustrating further example time corresponding with the example SoC of FIG. 2. In this example, FIG. 4 illustrates stable clock signals that can be generated by the clock dividers in the adjustable voltage domain 240 of the 200, based on signal timing such as shown in FIG. 3. Accordingly, for purposes of illustration, the timing diagram 400 will be described with further reference to FIGS. 2 and 3.

In the example of FIG. 4, a 48 MHz clock signal 402 corresponds with the signal 302 in FIG. 3, a scaling configuration signal 412 corresponds with the signal 312a and the signal 318a (prior to capture by the XTAL clock divider 220), a sys_clk signal 414 corresponds with the signal 314 and 320, and a captured frequency indication signal 447 corresponds with the signal 316b and the signal 322b. As shown in FIG. 4, a clk_A signal 444 can be generated by the clock divider A 244 based on the sys_clk signal 414 and the captured frequency indication signal 447, as a stable 16 MHz clock.

Further, a clk_C signal 445 can be generated by the clock divider C 245, e.g., as a stable 8 MHz clock signal, or a divide by 2 of the clk_A signal 444. In some implementations, the clk_C signal 445 can be based on the clk_A signal 444 and/or the sys_clk signal 414 (depending on whether the clock divider C 245 simply applies a divide by 2 to the clk_A signal 444 or, respectively, uses the clk_A signal 444 as an enable signal to determine when to count rising edges of the sys_clk signal 414.

Still further, a clk_D signal 446 can be generated by the clock divider D 246, as a stable 1 MHz clock signal. In some implementations, the clk_D signal 446 can be based on the clk_C signal 445 and/or the sys_clk signal 414, e.g., depending on whether the clock divider D 246 simply applies a divide by 8 to the clk_C signal 445 or, respectively, uses the clk_C signal 445 as an enable signal to determine when to count rising edges of the sys_clk signal 414.

Figure 5:
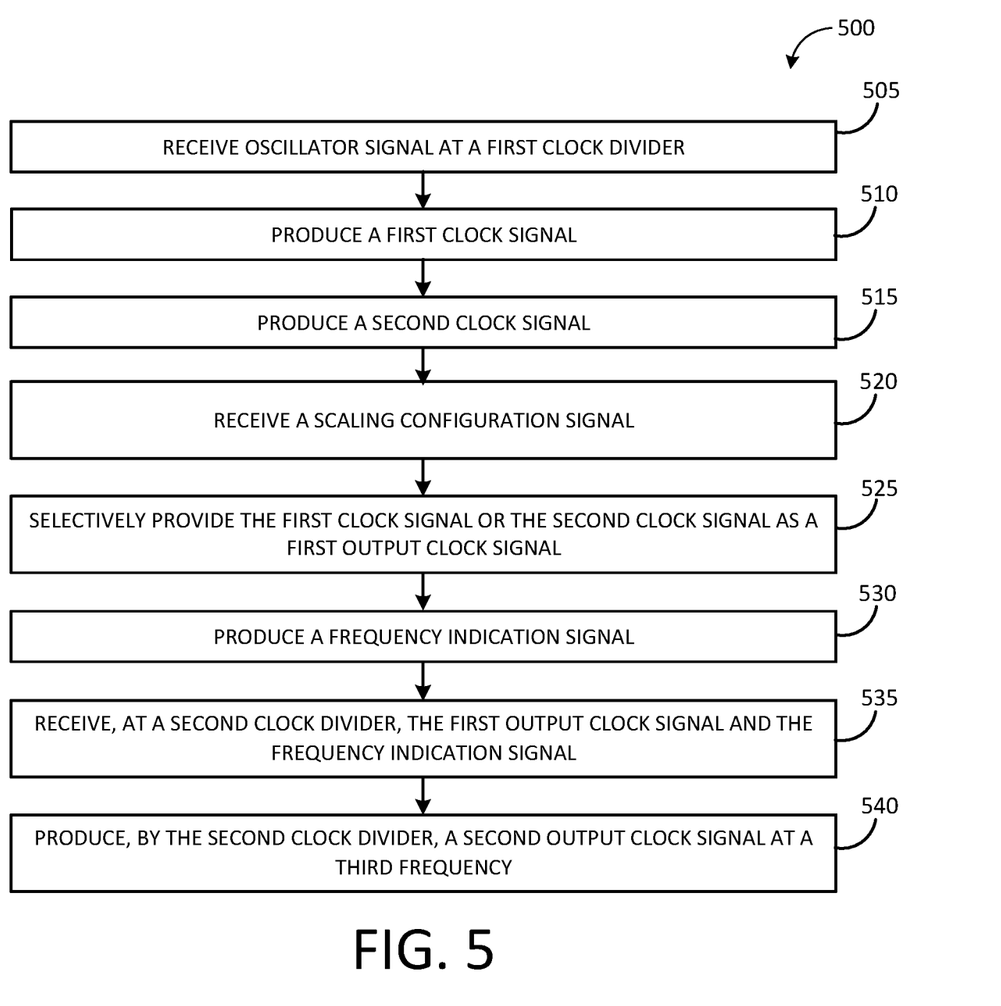
FIG. 5 is a flowchart illustrating an example method that can implemented in the SoC of FIG. 2.

FIG. 5 is a flowchart illustrating an example method 500 that can be implemented by the SoC of FIG. 2, e.g., in accordance with the signal timing shown and described with respect to FIGS. 3 and 4. Accordingly, for purposes of illustration, and by way of example, the method 500 will be described with further reference to FIGS. 2 and 3. In some implementations, however, the method 500 can be implemented with other systems and/or devices having different configurations.

In this example, as shown in FIG. 5, at block 505, the method 500 includes receiving an oscillator signal at the XTAL clock divider 220 from the XTAL oscillator 210. For instance, the received oscillator signal can be at a frequency of oscillation of the crystal 205. At block 510, the method 500 includes producing, by the XTAL clock divider 220 based on the oscillator signal, a first clock signal at the first frequency, such as the 48 MHz clock signal 302. At block 515, the method 500 includes producing, by the XTAL clock divider 220 based on the oscillator signal, a second clock signal at a second frequency, where the second frequency is a division of the first frequency by an integer greater than 1. In this example, the second clock signal of block 515 can be the 16 MHz clock signal 306 (e.g., a divide by 3 of the oscillator signal frequency), which can be produced based on the signal 303b of the rising edge counter in combination with the signal 304a of the falling edge counter (e.g., as a NOR operation), as shown in FIG. 3. As noted above, in implementations where even division of the oscillator signal is used to produce the second clock signal of block 515, a single, rising edge counter can be used, where the counter is configured with a count value corresponding with a desired frequency division.

At block 520, the method 500 includes receiving a scaling configuration signal at the XTAL clock divider 220. For instance, in this example, the scaling configuration signal can be the scaling configuration signal 312a (e.g., when a change from an undivided system clock to a divided system clock is requested) or the scaling configuration signal 318a (e.g., when a change from a divided system clock to an undivided system clock is requested). In some implementations, the scaling configuration signal of block 520 can be captured by XTAL clock divider 220 on a rising edge of the first clock signal of block 510 (the 48 MHz clock signal 302) at a start of a new clock period of the second clock signal of block 515 (the 16 MHz clock signal 306).

In the method 500, at block 525, the XTAL clock divider 220 can selectively provide (e.g., using a multiplexer) the first clock signal of block 510 or the second clock signal of block 515 to the adjustable voltage domain 240 as a sys_clk signal (e.g., the signal 314 or the signal 320). For instance, the first clock signal of block 510 can be provided in response to the captured scaling configuration signal having a first value (e.g., logic 0), or the second clock signal of block 515 can be provided in response to the captured scaling configuration signal having a second value (e.g., logic 1).

At block 530, the XTAL clock divider 220 can also provide a frequency indication signal (e.g., the signal 316a, or the signal 322a) that can be captured by the capture circuit 242 (e.g., respectively as the signal 316b, or the signal 322b). The captured frequency indication signal, in combination with the first output clock signal, can indicate a start of a new clock period of the second clock signal (e.g., to control a clock divider to run, or be clocked at a frequency of the second clock signal of the XTAL clock divider 220).

At block 535, the method 500 includes receiving, at a second clock divider, such as the clock divider A 244, the first output clock signal and the frequency indication signal (e.g., the captured frequency indication signal) and, at block 540, producing, by the second clock divider, a second output clock signal (e.g., such as the signal 444) at a third frequency. In this example, the second output clock signal is based on the first output clock signal and the frequency indication signal. That is, the frequency indication signal can indicate to the second clock divider when it should, or should not count, so as to produce the second output clock signal such that it is stable whether the selectively provided clock signal of block 525, e.g., sys_clk, is divided or undivided. In implementations, the third frequency of the second output clock signal of block 540 can be a division of the second frequency by an integer greater than or equal to 1.

Figure 6:
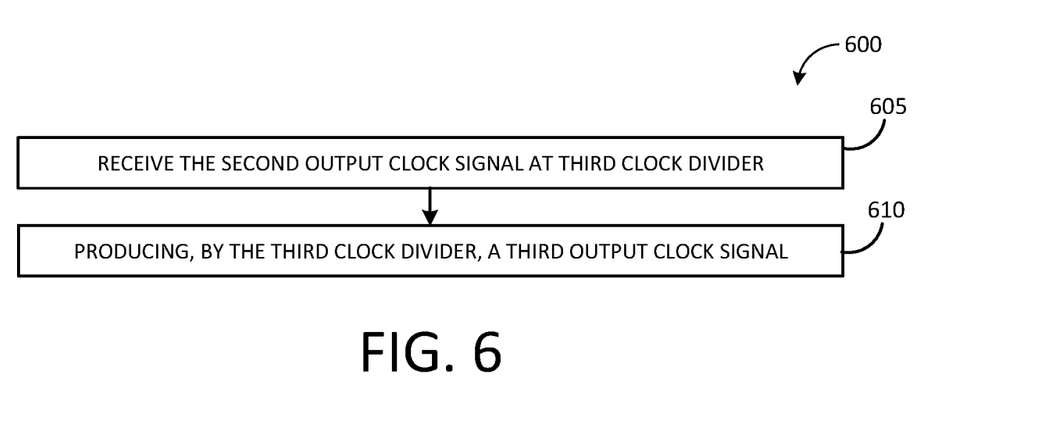
FIG. 6 is a flowchart illustrating an example method that can be implemented in conjunction with the method of FIG. 5.

FIG. 6 is a flowchart illustrating an example method 600 that can be implemented in conjunction with the method of FIG. 5. That is, as with the method 500, the method 600 that can be implemented in the SoC of FIG. 2, e.g., in accordance with the signal timing shown and described with respect to FIGS. 3 and 4. Accordingly, for purposes of illustration, and by way of example, the method 600 will also be described with further reference to FIGS. 2 to 5. In some implementations, however, the method 600 can be implemented in other systems and/or devices having different configurations.

At block 605, the method 600 includes receiving the second output clock signal of block 540 at a third clock divider, such as the clock divider C 245. At block 610, the method 600 includes producing, by the clock divider C 245, based on the second output clock signal, a third output clock signal (e.g., the signal 445) at a fourth frequency, e.g., using one or more counters and/or a count enable signal. In this example, the fourth frequency can be a division of the third frequency by an integer greater than or equal to 1. Additional clock dividers, such as the clock divider D 246, can be used to produce respective output clock signals, such as the signal 446, that are divided or undivided versions of their received clock signal, e.g., an output clock signal from another clock divider.

Figure 7:
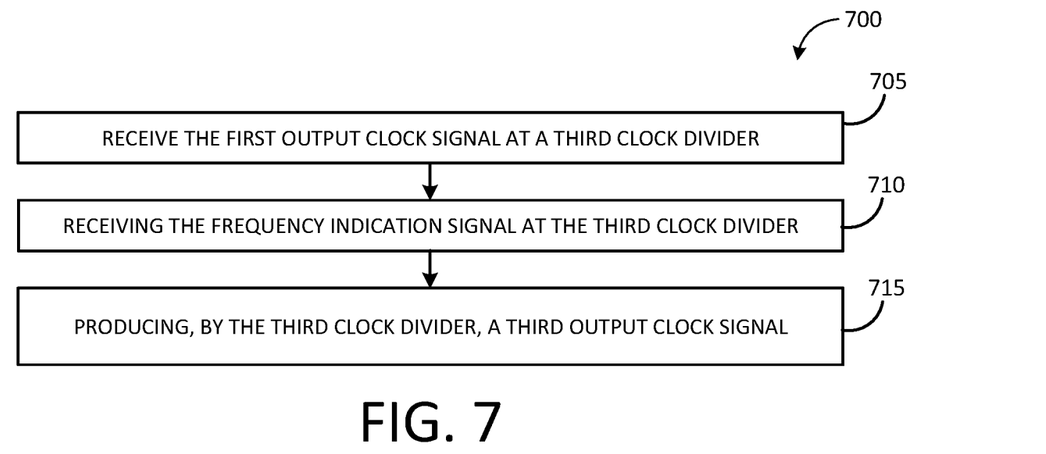
FIG. 7 is a flowchart illustrating an example method that can be implemented in conjunction with the method of FIG. 5 and/or the method of FIG. 6.

FIG. 7 is a flowchart illustrating an example method that can be implemented in conjunction with the method of FIG. 5 and/or the method of FIG. 6. That is, as with the method 500 and the method 600, the method 700 that can be implemented in the SoC of FIG. 2, e.g., in accordance with the signal timing shown and described with respect to FIGS. 3 and 4. Accordingly, for purposes of illustration, and by way of example, the method 700 will also be described with further reference to FIGS. 2 to 5. In some implementations, however, the method 700 can be implemented in other systems and/or devices having different configurations. For purposes of illustration, the method 700 is described as being implemented in conjunction with the method 500. Accordingly, the designations of third clock divider and fourth frequency in FIG. 7 are relative to corresponding clock divider and a frequency designations in the method 500 of FIG. 5.

At block 705, the method 700 includes receiving the first output clock signal at a third clock divider, such as the clock divider B 247 and, at block 710, receiving the frequency indication signal at the third clock divider. At block 715, the method 700 includes producing, by the third clock divider based on the first output clock signal and the frequency indication signal, a third output clock signal (e.g., such as the signal 444) at a fourth frequency, such as using the approaches described herein. In this example, the fourth frequency can be a division of the second frequency by an integer greater than or equal to 1.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification and/or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array), a programmable circuit or chipset, and/or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A system on a chip (SoC) comprising:
a first clock divider configured to:
produce, based on an oscillator signal at a first frequency:
a first clock signal at the first frequency; and
a second clock signal at a second frequency being a division of the first frequency by an integer greater than 1;
selectively provide the first clock signal as a first output clock signal when a scaling configuration signal has a first value;
selectively provide the second clock signal as the first output clock signal when the scaling configuration signal has a second value; and
produce a frequency indication signal indicating, in combination with the first output clock signal, a start of a new clock period of the second clock signal; and
a second clock divider configured to:
produce a second output clock signal at a third frequency, the second output clock signal being based on the first output clock signal and the frequency indication signal, the third frequency being a division of the second frequency by an integer greater than or equal to 1.

2. The SoC of claim 1, where the frequency indication signal is a captured frequency indication signal, the SoC further comprising a capture circuit configured to:
capture the frequency indication signal based on the first output clock signal; and
provide the captured frequency indication signal to the second clock divider.

3. The SoC of claim 2, wherein the capture circuit includes a flip-flop that is clocked on rising edges of the first output clock signal.

4. The SoC of claim 1, further comprising a third clock divider configured to:
receive the second output clock signal; and
produce, based on the second output clock signal, a third output clock signal at a fourth frequency, the fourth frequency being a division of the third frequency by an integer greater than or equal to 1.

5. The SoC of claim 4, further comprising a fourth clock divider configured to:
receive the third output clock signal; and
produce, based on the third output clock signal, a fourth output clock signal at a fifth frequency, the fifth frequency being a division of the fourth frequency by an integer greater than or equal to 1.

6. The SoC of claim 1, further comprising a third clock divider configured to:
receive the first output clock signal;
receive the frequency indication signal; and
produce a third output clock signal at a fourth frequency, the third output clock signal being based on the first output clock signal and the frequency indication signal, the fourth frequency being a division of the second frequency by an integer greater than or equal to 1.

7. The SoC of claim 1, wherein the scaling configuration signal is captured by the first clock divider on a rising edge of the first clock signal at a start of a new clock period of the second clock signal, the captured scaling configuration signal controlling multiplexing between the first clock signal and the second clock signal for the first output clock signal.

8. The SoC of claim 1, further comprising digital circuitry operating based on a least one of the first output clock signal or the second output clock signal, wherein:
the digital circuitry operates at a first voltage when the first clock signal is selected as the first output clock signal; and
the digital circuitry operates a second voltage when the second clock signal is selected as the first output clock signal.

9. The SoC of claim 8, wherein the scaling configuration signal is provided by the digital circuitry.

10. The SoC of claim 8, wherein the first clock divider is further configured to:
produce, based on the oscillator signal a third output clock signal at a third frequency, the third frequency being a division of the first frequency by an integer greater than or equal to 1.

11. The SoC of claim 10, further comprising:
a clock gate configured to:
receive the third output clock signal;
receive a first clock gate enable signal provided by the digital circuitry; and
provide, based on the third output clock signal and the clock gate enable signal, a first gated clock signal.

12. The SoC of claim 8, wherein the first clock divider is further configured to:
produce, based on the oscillator signal a third output clock signal at a third frequency, the third frequency being a division of the first frequency by an integer greater than 1.

13. The SoC of claim 12, further comprising:
a clock gate configured to:
receive the third output clock signal;
receive a first clock gate enable signal provided by the digital circuitry; and
provide, based on the third output clock signal and the clock gate enable signal, a first gated clock signal.

14. A system on a chip (SoC) comprising:
an oscillator configured to produce an oscillator signal at a first frequency;
a first clock divider configured to:
produce, based on the oscillator signal:
a first clock signal at the first frequency; and
a second clock signal at a second frequency being a division of the first frequency by an integer greater than 1;
selectively provide the first clock signal as a first output clock signal when a scaling configuration signal has a first value;
selectively provide the second clock signal as the first output clock signal when the scaling configuration signal has a second value; and
produce a frequency indication signal indicating, in combination with the first output clock signal, a start of a new clock period of the second clock signal;
a second clock divider configured to:
produce a second output clock signal at a third frequency, the second output clock signal being based on the first output clock signal and the frequency indication signal, the third frequency being a division of the second frequency by an integer greater than or equal to 1; and
a third clock divider configured to:
produce, based on the second output clock signal, a third output clock signal at a fourth frequency being a division of the third frequency by an integer greater than 1.

15. The SoC of claim 14, further comprising a fourth clock divider configured to:
receive the first output clock signal;
receive the frequency indication signal; and
produce a fourth output clock signal at a fifth frequency, the fourth output clock signal being based on the first output clock signal and the frequency indication signal, the fifth frequency being a division of the second frequency by an integer greater than or equal to 1.

16. The SoC of claim 15, where the frequency indication signal is a captured frequency indication signal, the SoC further comprising a capture circuit configured to:
capture the frequency indication signal based on the first output clock signal; and
provide the captured frequency indication signal to the fourth clock divider.

17. The SoC of claim 14, where the frequency indication signal is a captured frequency indication signal, the SoC further comprising a capture circuit configured to:
capture the frequency indication signal based on the first output clock signal; and
provide the captured frequency indication signal to the second clock divider.

18. A method for operation a system on a chip (SoC), the method comprising:
producing, based on an oscillator signal at a first frequency, a first clock signal at the first frequency;
producing, based on the oscillator signal, a second clock signal at a second frequency being a division of the first frequency by an integer greater than 1;
selectively, based on a scaling configuration signal:
providing the first clock signal as a first output clock signal when the scaling configuration signal has a first value; or
providing the second clock signal as the first output clock signal when the scaling configuration signal has a second value;

producing a frequency indication signal indicating, in combination with the first output clock signal, a start of a new clock period of the second clock signal; and producing, by a second clock divider, a second output clock signal at a third frequency, the second output clock signal being based on the first output clock signal and the frequency indication signal, the third frequency being a division of the second frequency by an integer greater than or equal to 1.

19. The method of claim 18, further comprising:
receiving the second output clock signal at a third clock divider; and
producing, by the third clock divider based on the second output clock signal, a third output clock signal at a fourth frequency, the fourth frequency being a division of the third frequency by an integer greater than or equal to 1.

20. The method of claim 18, further comprising a third clock divider configured to:
receiving the first output clock signal at a third clock divider;
receiving the frequency indication signal at the third clock divider; and
producing, by the third clock divider based on the first output clock signal and the frequency indication signal, a third output clock signal at a fourth frequency, the fourth frequency being a division of the second frequency by an integer greater than or equal to 1.

21. The SoC of claim 1, wherein the first clock divider is further configured to receive one or more gated clock enable signals.

22. The SoC of claim 21, wherein the first clock signal is enabled or disabled by a first gated clock enable signal of the one or more gated clock enable signals.

23. The SoC of claim 1, wherein the first frequency is 48 MHz and the second frequency is 16 MHz.

24. The method of claim 18, further comprising:
capturing the frequency indication signal; and
providing the captured frequency indication signal to the second clock divider.

* * * * *